US012759106B2

(12) United States Patent
Kurusu et al.

(10) Patent No.: US 12,759,106 B2
(45) Date of Patent: Oct. 13, 2026

(54) SUBSTRATE CLEANING MEMBER, SUBSTRATE PROCESSING APPARATUS AND SUBSTRATE CLEANING METHOD

(71) Applicant: TOKYO ELECTRON LIMITED, Tokyo (JP)

(72) Inventors: Kento Kurusu, Koshi City (JP); Akihiro Kubo, Koshi City (JP); Noboru Nakashima, Koshi City (JP); Yasunari Kasai, Koshi City (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 406 days.

(21) Appl. No.: 18/496,824

(22) Filed: Oct. 27, 2023

(65) Prior Publication Data

US 2024/0139780 A1 May 2, 2024

(30) Foreign Application Priority Data

Oct. 28, 2022 (JP) ................................ 2022-173467
May 11, 2023 (JP) ................................ 2023-078730

(51) Int. Cl.
*B24B 29/00* (2006.01)
*B24B 53/053* (2006.01)
(Continued)

(52) U.S. Cl.
CPC ............ *B24B 29/00* (2013.01); *B24B 53/053* (2013.01); *H10P 70/15* (2026.01); *H10P 70/56* (2026.01); *H10P 72/0412* (2026.01)

(58) Field of Classification Search
CPC . B24B 29/00; B24B 53/053; H01L 21/02052; H01L 21/0209; H01L 21/67046; H10P 70/15; H10P 70/56; H10P 72/0412
See application file for complete search history.

(56) References Cited

U.S. PATENT DOCUMENTS 5,389,032 A * 2/1995 Beardsley ............ B24D 13/147 451/529
6,315,645 B1 * 11/2001 Zhang ..................... B24B 37/26 451/529
(Continued)

FOREIGN PATENT DOCUMENTS

JP 2015-23248 A 2/2015

*Primary Examiner* — Matthew Wiblin
(74) *Attorney, Agent, or Firm* — Nath, Goldberg & Meyer; Jerald L. Meyer; Tanya E. Harkins

(57) ABSTRACT

A substrate cleaning member includes: a first member including a first contact surface, wherein the first member is configured to clean or polish a main surface of a substrate by moving the first contact surface along the main surface while the first contact surface is in contact with the main surface; a second member including a second contact surface, wherein the second member is configured to clean the main surface by moving the second contact surface along the main surface while the second contact surface is in contact with the main surface; a lower-layer member configured to support the second member such that the second contact surface protrudes beyond the first contact surface in an axial direction in which the predetermined axis extends; and a base configured to support the first member, the second member and the lower-layer member.

8 Claims, 15 Drawing Sheets

(51) Int. Cl.
*H10P 70/00* (2026.01)
*H10P 72/00* (2026.01)

(56) References Cited

U.S. PATENT DOCUMENTS

| | | | | |
|---|---|---|---|---|
| 9,089,943 | B2 * | 7/2015 | Lipson | B24B 29/00 |
| 11,986,922 | B2 * | 5/2024 | Fung | B24B 49/003 |
| 2014/0158160 | A1 * | 6/2014 | Ishibashi | H01L 21/67051<br>15/103.5 |
| 2015/0133032 | A1 * | 5/2015 | Kubo | B24B 49/16<br>451/73 |
| 2021/0220878 | A1 * | 7/2021 | Kubo | H01L 21/02052 |

* cited by examiner

SUBSTRATE CLEANING MEMBER, SUBSTRATE PROCESSING APPARATUS AND SUBSTRATE CLEANING METHOD

CROSS-REFERENCE TO RELATED APPLICATIONS

This application is based upon and claims the benefit of priority from Japanese Patent Application Nos. 2022-173467 and 2023-078730, filed on Oct. 28, 2022 and May 11, 2023, respectively, the entire contents of which are incorporated herein by reference.

TECHNICAL FIELD

The present disclosure relates to a substrate cleaning member, a substrate processing apparatus, and a substrate cleaning method.

BACKGROUND

Patent Document 1 discloses, as an apparatus for cleaning a rear surface of a substrate, a configuration related to a cleaning member that comes into contact with and cleans the rear surface of the substrate when the substrate is held by a spin chuck.

PRIOR ART DOCUMENTS

Patent Documents

Patent Document 1: Japanese Patent Laid-Open Publication No. 2015-23248

SUMMARY

According to one embodiment of the present disclosure, there is provided a substrate cleaning member. The substrate cleaning member includes: a first member including a first contact surface, an outer edge of which is formed along a circumference around a predetermined axis, wherein the first member is configured to clean or polish a main surface of a substrate by moving the first contact surface along the main surface while the first contact surface is in contact with the main surface; a second member including a second contact surface, an outer edge of which is formed along the circumference outside or inside the first contact surface, wherein the second member is configured to clean the main surface by moving the second contact surface along the main surface while the second contact surface is in contact with the main surface; a lower-layer member configured to support the second member such that the second contact surface protrudes beyond the first contact surface in an axial direction in which the predetermined axis extends; and a base configured to support the first member, the second member and the lower-layer member, wherein the second contact surface is configured such that at least one of surface roughness and hardness of the second contact surface is different from that of the first contact surface, and wherein the lower-layer member is made of a softer material than the second member such that, when the second member receives a contact force from the main surface, a position of the second contact surface approaches a position of the first contact surface in the axial direction.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
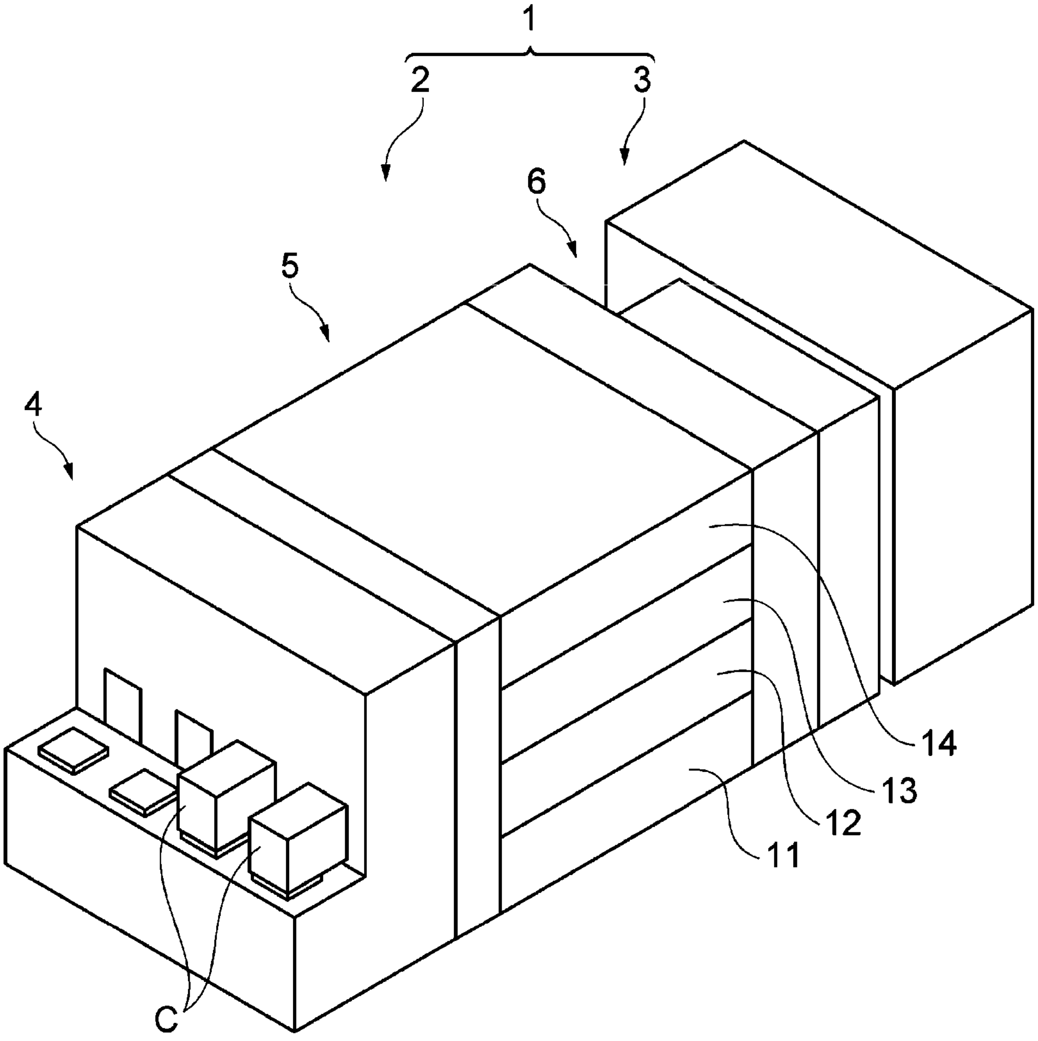
FIG. 1 is a schematic view illustrating an example of a substrate processing system.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments will be described with reference to the drawings. In the description, the same elements or elements having the same function will be denoted by the same reference numerals, and a redundant description will be omitted. Some drawings show a Cartesian coordinate system defined by X, Y, and Z axes. In the following embodiments, the Z axis corresponds to a vertical direction, and the X and Y axes correspond to a horizontal direction. The Z-axis positive direction corresponds to the vertically upward direction, and the Z-axis negative direction corresponds to the vertically downward direction.

[Substrate Processing Apparatus]

A substrate processing system 1 (a substrate processing apparatus) illustrated in FIG. 1 is a system for performing, on a workpiece W, formation of a photosensitive film, exposure of the photosensitive film, and development of the photosensitive film. The workpiece W to be processed is, for example, a substrate, or a substrate on which a film or a circuit is formed by being subjected to a predetermined process. The substrate is, for example, a silicon wafer. The workpiece W (substrate) may be circular. The workpiece W may be a glass substrate, a mask substrate, a flat panel display (FPD), or the like.

When a bevel (chamfer) exists on the edge of the workpiece W, the "front surface" of the workpiece W in the present disclosure also includes a bevel portion when viewed from the front surface side of the workpiece W, and the "rear surface" of the workpiece W also includes a bevel portion when viewed from the rear surface side of the workpiece W. Of a pair of main surfaces of the work piece W, the front surface (hereinafter, referred to as a "front surface Wa") of the workpiece W is a main surface on which a photosensitive film is formed. The rear surface (hereinafter, referred to as a "rear surface Wb") of the workpiece W is the main surface opposite to the front surface Wa of the pair of main surfaces. The photosensitive film is, for example, a resist film.

Figure 2:
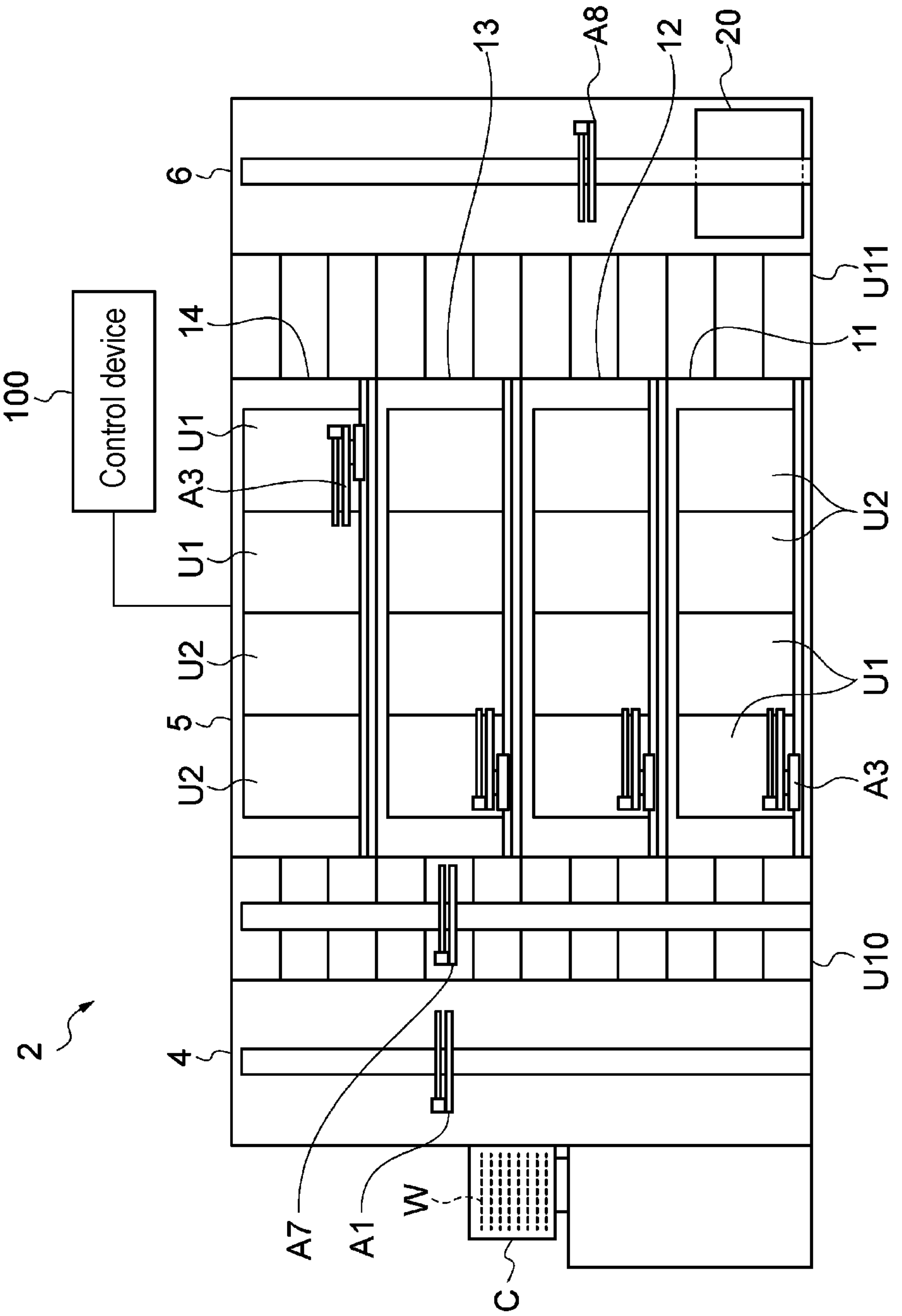
FIG. 2 is a schematic view illustrating an exemplary coating/developing apparatus.
Figure 3:
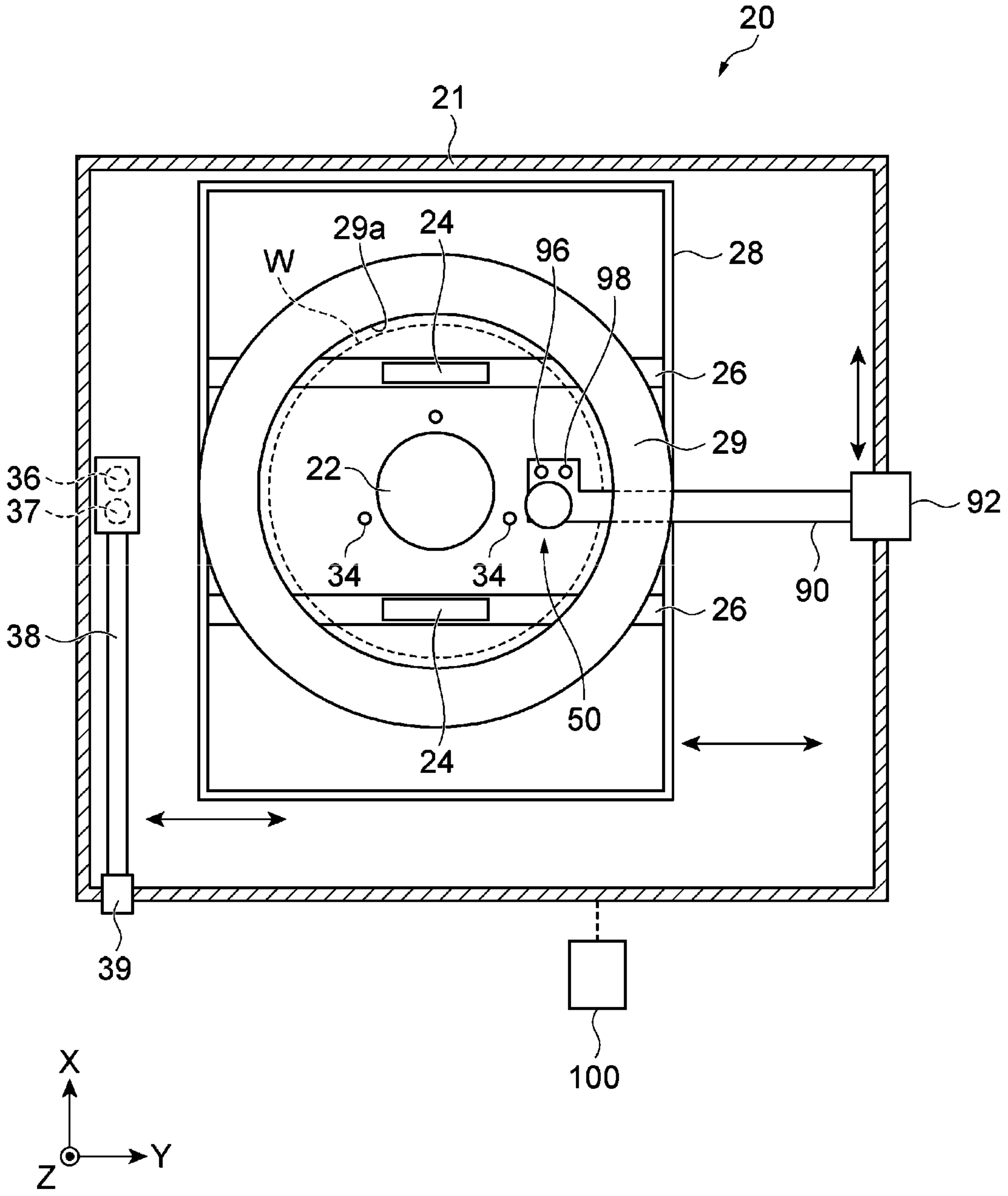
FIG. 3 is a top view schematically illustrating an example of a polishing unit.

As illustrated in FIGS. 1 and 2, the substrate processing system 1 includes a coating/developing apparatus 2, an exposure apparatus 3, and a control device 100. The exposure apparatus 3 is an apparatus for exposing a resist film (photosensitive film) formed on a workpiece W (substrate). Specifically, the exposure apparatus 3 irradiates an exposure target portion of the resist film with an energy beam by a method such as liquid immersion exposure. The energy beam may be, for example, ionizing radiation or non-ionizing radiation.

The coating/developing apparatus 2 (substrate processing apparatus) applies a resist to the front surface Wa of the workpiece W to form a resist film before an exposure process by the exposure apparatus 3. The coating/developing apparatus 2 may perform a developing process of the resist film after the exposure process in addition to the process of forming a resist film. The exposure apparatus 3 selectively irradiates a portion of the resist film to be exposed with an energy beam before the developing process. The coating/developing apparatus 2 includes, for example, a carrier block 4, a processing block 5, an interface block 6, and a polishing unit 20.

The carrier block 4 introduces a workpiece W into the coating/developing apparatus 2 and takes out a workpiece W from the coating/developing apparatus 2. The carrier block 4 includes therein, for example, a transfer apparatus A1 including a transfer arm and configured to support a plurality of carriers C for workpieces W. Each carrier C accommodates, for example, a plurality of circular workpieces W. The transfer apparatus A1 takes the workpieces W out of the carriers C to deliver workpieces W to the processing block 5, and receives workpieces W from the processing block 5 to return the workpieces W into the carriers C. The processing block 5 includes processing modules 11, 12, 13, and 14.

The processing module 11 includes therein a liquid-processing unit U1, a heat treatment unit U2, and a transfer apparatus A3 configured to transfer workpieces W to these units. The processing module 11 forms an underlayer film on the front surface Wa of each workpiece W by using the liquid-processing unit U1 and the heat treatment unit U2. The liquid-processing unit U1 supplies a processing liquid for forming the underlayer film to the front surface Wa of the workpiece W to apply the processing liquid onto the front surface Wa of the workpiece W. The heat treatment unit U2 performs various kinds of heat treatment associated with the formation of the underlayer film.

The processing module 12 includes therein a liquid-processing unit U1, a heat treatment unit U2, and a transfer apparatus A3 configured to transfer workpieces W to these units. The processing module 12 forms a resist film on the underlayer film by using the liquid-processing unit U1 and the heat treatment unit U2. The liquid-processing unit U1 supplies a processing liquid for forming a resist film to the front surface Wa of each workpiece W to apply the processing liquid onto the underlayer film. The heat treatment unit U2 performs various kinds of heat treatment associated with the formation of the resist film.

The processing module 13 includes therein a liquid-processing unit U1, a heat treatment unit U2, and a transfer apparatus A3 configured to transfer workpieces W to these units. The processing module 13 forms an upper-layer film on a resist film by using the liquid-processing unit U1 and the heat treatment unit U2. The liquid-processing unit U1 supplies a processing liquid for forming an upper-layer film to the front surface Wa of the workpiece W to apply the processing liquid onto the resist film. The heat treatment unit U2 performs various kinds of heat treatment associated with the formation of the upper-layer film.

The processing module 14 includes therein a liquid-processing unit U1, a heat treatment unit U2, and a transfer apparatus A3 configured to transfer workpieces W to these units. The processing module 14 performs a developing process and heat treatment associated with the developing process on resist films subjected to the exposure process by using the liquid-processing unit U1 and the heat treatment unit U2. The liquid-processing unit U1 is a unit that executes liquid-processing (developing process) on the workpieces W by using a developer. The liquid-processing unit U1 supplies a developer onto the front surface Wa of each exposed workpiece W and performs a developing process on the resist film formed on the front surface Wa of the workpiece W. After performing the developing process with the developer, the liquid-processing unit U1 rinses away the developer on the front surface Wa of the workpiece W with a rinse liquid. The heat treatment unit U2 performs various kinds of heat treatment associated with the developing process. Specific examples of heat treatment include a heating process before the developing process (post-exposure bake (PEB)) and a heating process after the developing process (post-bake (PB)).

A shelf unit U10 is provided on the carrier block 4 side in the processing block 5. The shelf unit U10 is partitioned into a plurality of cells arranged in the vertical direction. A transfer apparatus A7 including a lifting arm is provided in the vicinity of the shelf unit U10. The transfer apparatus A7 raises and lowers workpieces W among the cells of the shelf unit U10.

A shelf unit U11 is provided on the interface block 6 side in the processing block 5. The shelf unit U11 is partitioned into a plurality of cells arranged in the vertical direction.

The interface block 6 delivers workpieces W to/from the exposure apparatus 3. For example, the interface block 6 includes therein a transfer apparatus A8 including a delivery arm, and is connected to the exposure apparatus 3. The transfer apparatus A8 transfers the workpieces W placed on the shelf unit U11 to the polishing unit 20, and delivers the workpieces W polished by the polishing unit 20 to the exposure apparatus 3. The transfer apparatus A8 receives the workpieces W from the exposure apparatus 3 and returns the workpieces W to the shelf unit U11. Details of the polishing unit 20 will be described later.

The control device 100 controls various apparatuses (units) included in the coating/developing apparatus 2. The control device 100 is configured with one or more control computers. When the control device 100 is configured with a plurality of control computers, the plurality of control computers may be connected to be capable of communicating with each other.

The control device 100 includes, for example, a storage and a controller as functional components. The storage of the control device 100 stores programs for operating various units and apparatuses included in the coating/developing apparatus 2. The storage of the control device 100 also stores various data (e.g., information related to signals for operating processing units such as the polishing unit 20 included in the coating/developing apparatus 2) and information from sensors provided in each unit.

The storage unit of the control device 100 is, for example, semiconductor memory, an optical recording disk, a magnetic recording disk, or a magneto-optical recording disk. The programs may also be included in an external storage device separate from the storage of the control device 100, or an intangible medium such as a propagation signal. The programs may be installed in the storage of the control device 100 from these other media and stored in the storage of the control device 100. The controller of the control device 100 controls operations of various units included in the coating/developing apparatus 2 and various apparatuses based on the program read from the storage.

The control device 100 controls the coating/developing apparatus 2 to execute a coating and developing process for one workpiece W, for example, in the following procedure. First, the control device 100 controls the transfer apparatus A1 to transfer a workpiece W in a carrier C to the shelf unit U10, and controls the transfer apparatus A7 to place the workpiece W in a cell for the processing module 11.

Next, the control device 100 controls the transfer apparatus A3 to transfer the workpiece W in the shelf unit U10 to the liquid-processing unit U1 and the heat treatment unit U2 in the processing module 11. In addition, the control device 100 controls the liquid-processing unit U1 and the heat treatment unit U2 to form an underlayer film on the front surface Wa of the workpiece W. Thereafter, the control device 100 controls the transfer apparatus A3 to return the workpiece W on which the underlayer film has been formed to the shelf unit U10, and controls the transfer apparatus A7 to place the workpiece W in a cell for the processing module 12.

Next, the control device 100 controls the transfer apparatus A3 to transfer the workpiece W in the shelf unit U10 to the liquid-processing unit U1 and the heat treatment unit U2 in the processing module 12. In addition, the control device 100 controls the liquid-processing unit U1 and the heat treatment unit U2 to form a resist film on the underlayer film of the workpiece W. Thereafter, the control device 100 controls the transfer apparatus A3 to return the workpiece W to the shelf unit U10, and controls the transfer apparatus A7 to place the workpiece W in a cell for the processing module 13.

Next, the control device 100 controls the transfer apparatus A3 to transfer the workpiece W in the shelf unit U10 to each unit in the processing module 13. In addition, the control device 100 controls the liquid-processing unit U1 and the heat treatment unit U2 to form an upper-layer film on the resist film of the workpiece W. Thereafter, the control device 100 controls the transfer apparatus A3 to transfer the workpiece W to the shelf unit U11.

Next, the control device 100 controls the transfer apparatus A8 to carry the workpiece W in the shelf unit U11 into the polishing unit 20 and to send the workpiece W polished by the polishing unit 20 to the exposure apparatus 3. Thereafter, the control device 100 controls the transfer apparatus A8 to receive the exposed workpiece W from the exposure apparatus 3 and to place the workpiece W in a cell for the processing module 14 in the shelf unit U11.

Next, the control device 100 controls the transfer apparatus A3 to transfer the workpiece W in the shelf unit U11 to each unit in the processing module 14, and controls the liquid-processing unit U1 and the heat treatment unit U2 to perform the developing process on the resist film of the workpiece W. Thereafter, the control device 100 controls the transfer apparatus A3 to return the workpiece W to the shelf unit U10, and controls the transfer apparatus A7 and the transfer apparatus A1 to return the workpiece W to the interior of the carrier C. Thus, the coating and developing process for one workpiece W is completed. The control device 100 similarly executes the coating/developing process for each of a plurality of other workpieces W as well.

The specific configuration of the substrate processing apparatus is not limited to the configuration of the substrate processing system 1 exemplified above. For example, unlike the example illustrated in FIG. 2, the polishing unit 20 may be provided in one of the processing modules 11, 12, 13 and 14 or may be provided outside the coating/developing apparatus 2.

(Polishing Unit)

Next, an example of the polishing unit 20 will be described with reference to FIGS. 3 to 6C. The polishing unit 20 (substrate processing apparatus) is a unit that performs a polishing process and a cleaning process on the rear surface Wb of a workpiece W. The polishing unit 20 includes a polishing/cleaning mechanism capable of performing both a polishing process and a cleaning process. The polishing unit 20 performs the polishing process on the rear surface Wb by the polishing/cleaning mechanism and then performs the cleaning process on the rear surface Wb by the polishing/cleaning mechanism. Each member included in the polishing unit 20 exemplified in FIGS. 3 and 4 will be described below.

The polishing unit 20 includes a housing 21, a pair of suction pads 24, a pair of support plates 26, a frame 28, a spin chuck 22, and an upper cup 29. The housing 21 accommodates at least some of various members included in the polishing unit 20. The housing 21 includes an opened top surface. In the example illustrated in FIG. 3, a pair of side walls of the housing 21 extends along the X-axis direction, and another pair of side walls extends along the Y-axis direction.

The pair of (two) suction pads 24 function as substrate holders that hold a workpiece W. The pair of suction pads 24 hold the rear surface Wb of the workpiece W by suction so that the workpiece W is horizontal. Each of the pair of suction pads 24 is formed in a rectangular shape extending along the Y-axis direction. The pair of suction pads 24 are arranged such that the spin chuck 22 is interposed therebetween in the X-axis direction. The pair of suction pads 24 hold the outer peripheral area of the rear surface Wb of the workpiece W.

The pair of support plates 26 are provided to correspond to the pair of suction pads 24, and each of the pair of support plates 26 supports a corresponding one of the suction pads 24. The pair of support plates 26 extend along the Y-axis direction, and the length of the support plates 26 in the Y-axis direction is greater than the length of the suction pads 24 in the Y-axis direction. The opposite ends of each support plate 26 in the Y-axis direction are connected (fixed) to the frame 28. The frame 28 is provided to be movable in both the horizontal direction (the Y-axis direction in FIG. 3) and the vertical direction (the Z-axis direction in FIG. 3). A drive mechanism is connected to the frame 28 to move the frame 28 in each of the Y-axis direction and the Z-axis direction.

The upper cup 29 is provided at the upper end of the frame 28. The upper cup 29 is formed in an annular shape and has a circular opening 29*a* formed in the top surface thereof. The diameter of the opening 29*a* is greater than the diameter of the workpiece W. The workpiece W is transferred between the pair of suction pads 24 and a transfer apparatus (e.g., the transfer apparatus A8) provided outside the polishing unit 20 via the opening 29*a*.

The spin chuck 22 functions as a substrate holder that holds the workpiece W. The spin chuck 22 is capable of receiving the workpiece W from the pair of suction pads 24, and holds the rear surface Wb of the workpiece W by suction so that the workpiece W is horizontal. The spin chuck 22 holds the central area located inside the outer peripheral area in the rear surface Wb of the workpiece W. The spin chuck 22 is formed in a disk shape, and the diameter of the spin chuck 22 is smaller than the diameter of the workpiece W.

Figure 4:
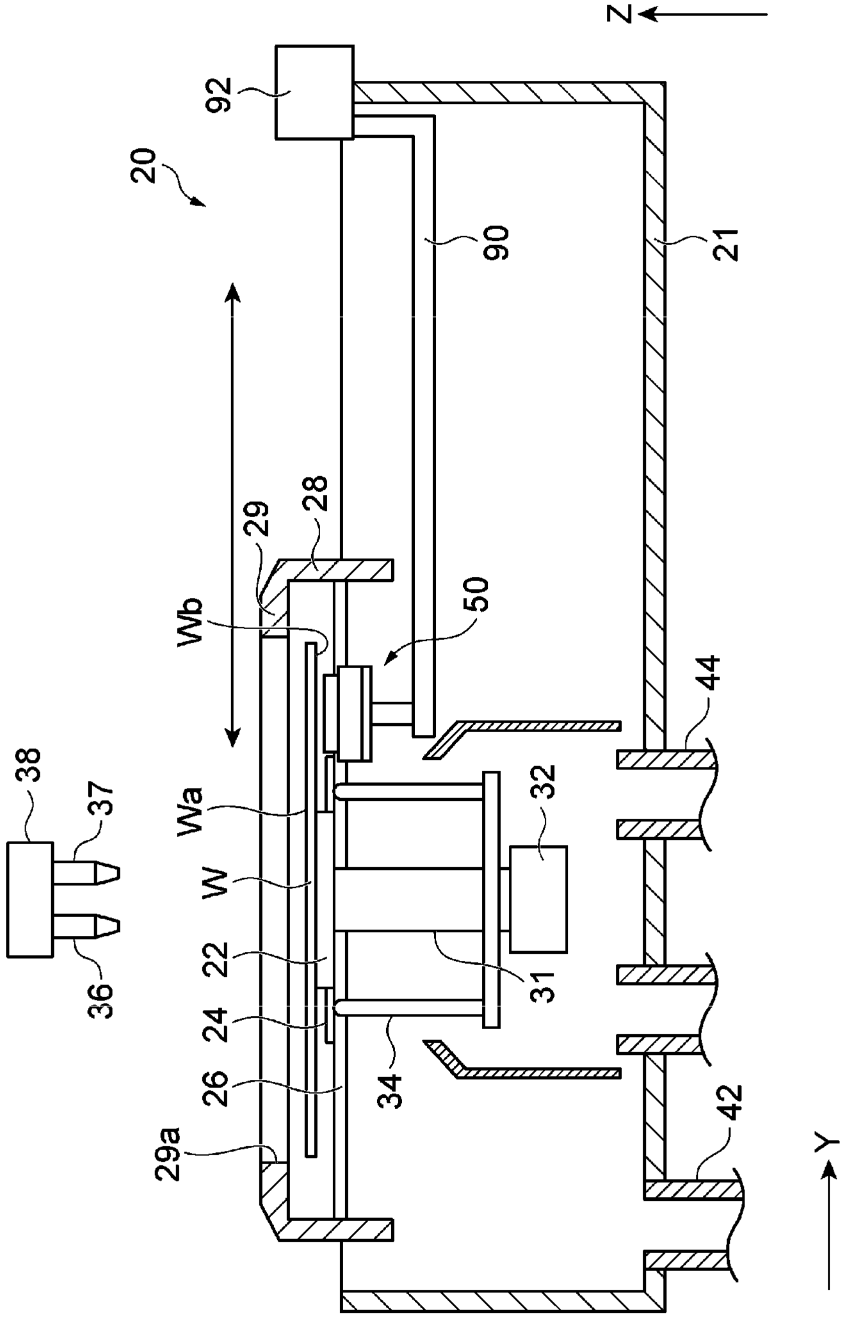
FIG. 4 is a side view schematically illustrating an example of the polishing unit.

As illustrated in FIG. 4, the polishing unit 20 has a shaft 31 and a drive mechanism 32. The spin chuck 22 is connected to the drive mechanism 32 via the shaft 31. The drive mechanism 32 rotates the spin chuck 22 around a vertical axis passing through the center of the spin chuck 22. In addition, the drive mechanism 32 moves the spin chuck 22 along the vertical direction. Although the details will be described later, the vertical position of the spin chuck 22 is changed by vertical driving by the drive mechanism 32 so that the force (contact force) received by the polishing/cleaning mechanism 50 when coming into contact with the workpiece W held by the spin chuck 22 can be adjusted.

The polishing unit 20 includes a plurality of lifting pins 34. The plurality of lifting pins 34 are provided to surround the spin chuck 22 in a plan view (seen from above). The plurality of lifting pins 34 can be lifted and lowered by a lifting drive mechanism. The workpiece W may be delivered between the plurality of lifting pins 34 and a transfer apparatus provided outside the polishing unit 20.

The polishing unit 20 includes a cleaning nozzle 36, a gas nozzle 37, a nozzle arm 38, and a drive mechanism 39. The cleaning nozzle 36 supplies a cleaning liquid to the front surface Wa of the workpiece W held by the substrate holder such as the spin chuck 22. The cleaning liquid is, for example, pure water. The gas nozzle 37 sprays a dry gas onto the front surface Wa of the workpiece W held by the substrate holder such as the spin chuck 22. The dry gas is, for example, nitrogen gas or clean air. The nozzle arm 38 holds the cleaning nozzle 36 and the gas nozzle 37. The drive mechanism 39 is connected to the nozzle arm 38 and moves the nozzle arm 38 in the vertical direction and in the horizontal direction (the Y-axis direction in FIG. 3).

As illustrated in FIG. 4, the polishing unit 20 includes a drain pipe 42 and an exhaust pipe 44. The drain pipe 42 and the exhaust pipe 44 are provided at the bottom of the housing 21. The drain pipe 42 discharges the liquid (such as the cleaning liquid) supplied into the housing 21 to the exterior of the housing 21 when performing a polishing process and a cleaning process on the workpiece W. The exhaust pipe 44 forms a gas current that flows downward inside the housing 21 by discharging the gas inside the housing 21 to the exterior of the housing 21.

<Substrate Cleaning Member>

Figure 5A:
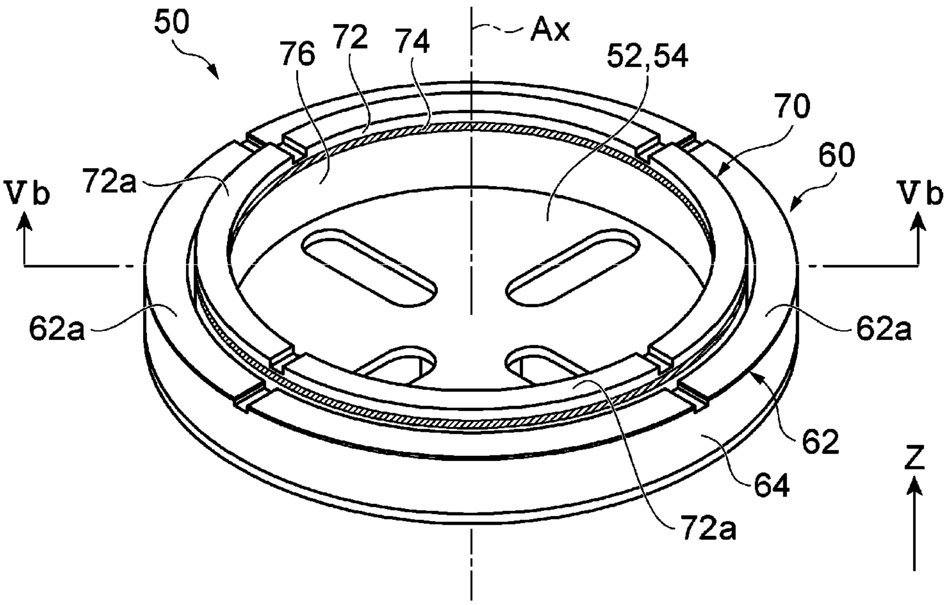
FIGS. 5A to 5C are schematic views illustrating an example of a substrate cleaning member.
Figure 5B:
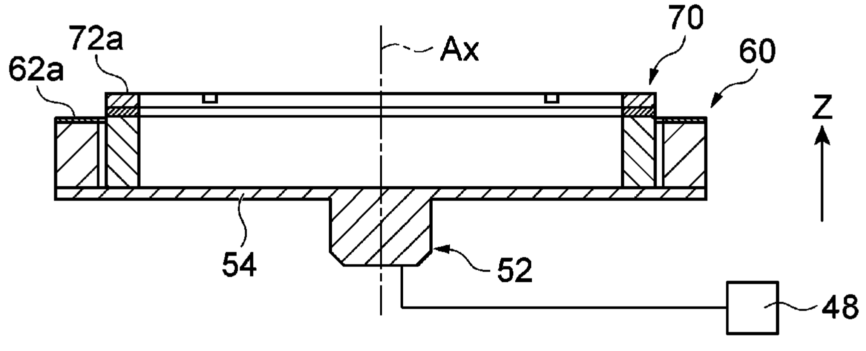
Figure 5C:
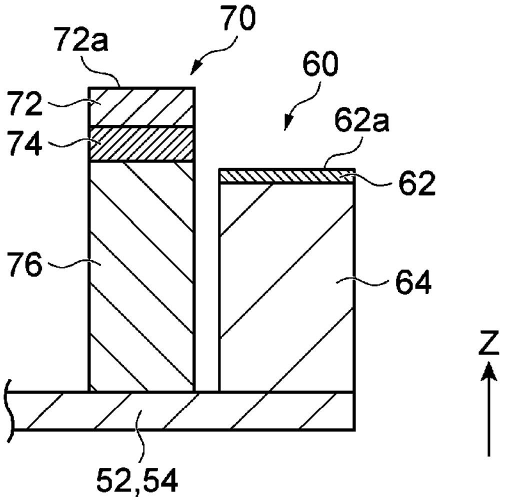

The polishing unit 20 includes a polishing/cleaning mechanism 50. The polishing/cleaning mechanism 50 functions as a substrate cleaning member that performs at least a cleaning process on a workpiece W. Hereinafter, the polishing/cleaning mechanism 50 exemplified in FIG. 5A and the like will be described. As illustrated in FIGS. 5A, 5B, and 5C, the polishing/cleaning mechanism 50 includes a base 52, a polishing element 60, and a cleaning element 70. The base 52 is an element that supports the polishing element 60 and the cleaning element 70. Both the polishing element 60 and the cleaning element 70 are connected to the base 52.

The base 52 includes a disk-shaped bottom portion 54. The diameter of the disk-shaped bottom portion 54 is smaller than the diameter of the workpiece W. The bottom portion 54 is arranged in the housing 21 of the polishing unit 20 so that the top surface thereof is horizontal. The bottom portion 54 may include one or more holes that penetrate the bottom portion 54 in the thickness direction thereof. The polishing unit 20 includes a rotary drive mechanism 48. The rotary drive mechanism 48 is connected to the base 52. The rotary drive mechanism 48 rotates the base 52 around a central axis Ax. The central axis Ax is an imaginary line orthogonal to the top surface of the bottom portion 54 and passing through the center of the bottom portion 54. As the base 52 rotates around the central axis Ax, the polishing element 60 and the cleaning element 70 supported by the base 52 rotate around the central axis Ax.

The polishing element 60 is an element that polishes at least a portion of the rear surface Wb of the workpiece W. The lower end of the polishing element 60 is connected to the bottom portion 54. The polishing element 60 is formed in an annular shape to extend along the circumference around the central axis Ax. The polishing element 60 is located at the outer edge portion (the outer edge and its vicinity) of the bottom portion 54. FIG. 5B illustrates a cross-sectional view of the polishing/cleaning mechanism 50 taken along a plane passing through the central axis Ax, and FIG. 5C is an enlarged view of a portion of the cross-sectional view of FIG. 5B. The outer edge of the polishing element 60 substantially coincides with the outer edge of the bottom portion 54 when viewed in the direction in which the central axis Ax extends (hereinafter, referred to as an "axial direction"). The axial direction of the central axis Ax corresponds to the Z-axis direction in FIG. 5A and the like.

The polishing element 60 includes a polishing member 62 and a support member 64. The polishing member 62 is provided on the support member 64, and the support member 64 is connected to the top surface of the bottom portion 54. The polishing member 62 and the support member 64 are connected to each other by an adhesive or the like. Each of the polishing member 62 and the support member 64 is formed in an annular shape to extend along the circumference around the central axis Ax.

The polishing member 62 (first member) includes a polishing surface 62*a*. The polishing surface 62*a* (first contact surface) is the top surface of the polishing member 62 opposite to the bottom surface connected to the support member 64, and faces the rear surface Wb of the workpiece W. Each of the outer edge and inner edge of the polishing surface 62*a* is formed along the circumference around the central axis Ax. The polishing member 62 is a member capable of polishing the rear surface Wb of the workpiece W by moving along the rear surface Wb in the state in which the polishing surface 62*a* is in contact with the rear surface Wb. At least the polishing surface 62*a* of the polishing member 62 is made of a material capable of polishing the rear surface Wb, wherein examples of the material include urethane foam and nonwoven fabric.

The polishing surface 62*a* may include a plurality of portions divided along the circumference around the central axis Ax when viewed in the axial direction of the central axis Ax. In the present disclosure, being formed in an annular shape includes not only the case of being formed continuously on the circumference, but also the case of being formed discontinuously to be divided into several portions. In the example illustrated in FIG. 5A, the polishing surface 62*a* is divided into four portions on the circumference.

The support member 64 is a member that supports the polishing member 62. The axial length (thickness) of the support member 64 is greater than the axial length (thickness) of the polishing member 62. The width of the support member 64 may substantially coincide with the width of the polishing member 62. When it is described that the widths substantially coincide with each other means that the size of one width is 0.95 to 1.05 times or 0.98 to 1.02 times the size of the other width. The width of the polishing member 62 and the width of the support member 64 are defined by the size of each member in the radial direction of the circumference around the central axis Ax (the radial direction of a circle centering on the central axis Ax). The width of the polishing member 62 and the width of the support member 64 are substantially constant at any position on the circumference around the central axis Ax, and are substantially constant at any position in the axial direction of the central axis Ax.

The cleaning element 70 is an element that cleans at least a portion of the rear surface Wb of the workpiece W. The cleaning element 70 is formed in an annular (cylindrical) shape to extend along the circumference around the central axis Ax inside the polishing element 60. The outer peripheral surface of the cleaning element 70 is surrounded by the polishing element 60 when viewed in the axial direction of the central axis Ax. The shortest distance between the central axis Ax and the cleaning element 70 is smaller than the shortest distance between the central axis Ax and the polishing element 60. A gap is formed between the cleaning element 70 and the polishing element 60 in the radial direction of the circumference around the central axis Ax.

The cleaning element 70 includes a cleaning member 72, a middle-layer member 74, and a lower-layer member 76. The cleaning member 72 is provided on the lower-layer member 76 via the middle-layer member 74, and the lower-layer member 76 is connected to the top surface of the bottom portion 54. The cleaning member 72 and the middle-layer member 74 are connected to each other by an adhesive or the like. The middle-layer member 74 and the lower-layer member 76 are connected to each other by an adhesive or the like. Each of the cleaning member 72, the middle-layer member 74, and the lower-layer member 76 is formed in an annular shape to extend along the circumference around the central axis Ax.

The cleaning member 72 (second member) includes a cleaning surface 72*a*. The cleaning surface 72*a* (second contact surface) is the top surface of the cleaning member 72 opposite to the bottom surface connected to the middle-layer member 74, and faces the rear surface Wb of the workpiece W. Each of the outer edge and the inner edge of the cleaning surface 72*a* is formed inside the polishing surface 62*a* of the polishing member 62 along the circumference around the central axis Ax. The cleaning member 72 is a member capable of cleaning the rear surface Wb of the workpiece W by moving along the rear surface Wb in the state in which the cleaning surface 72*a* is in contact with the rear surface Wb. The cleaning surface 72*a* may include a plurality of portions divided along the circumference around the central axis Ax when viewed in the axial direction of the central axis Ax.

The cleaning member 72 is made of a material capable of cleaning the rear surface Wb. The cleaning member 72 is made of a material different from that of the polishing member 62, wherein examples of the material include polyvinyl alcohol (PVA), polypropylene, and nylon. The cleaning surface 72*a* of the cleaning member 72 is formed such that at least one of surface roughness and hardness (surface hardness) is different from that of the polishing surface 62*a* of the polishing member 62. One or both of surface roughness and hardness are different between the cleaning surface 72*a* and the polishing surface 62*a*. The surface roughness of each of the cleaning surface 72*a* and the polishing surface 62*a* is defined by, for example, an arithmetic mean roughness Ra. The surface roughness of the cleaning surface 72*a* may be larger or smaller than that of the polishing surface 62*a*. The hardness of each of the cleaning surface 72*a* and the polishing surface 62*a* is defined by, for example, Vickers hardness. The hardness of the cleaning surface 72*a* may be lower than the hardness of the polishing surface 62*a*.

The middle-layer member 74 is disposed between the cleaning member 72 and the lower-layer member 76. The middle-layer member 74 is formed in a plate shape. The middle-layer member 74 may be made of a harder material than the cleaning member 72 and the lower-layer member 76, and is made of, for example, hard plastic (hard resin). The middle-layer member 74 is harder than the cleaning member 72 and is also harder than the lower-layer member 76. Examples of the material for forming the middle-layer member 74 include polystyrene, ABS resin, polyamide, and the like. The length of the middle-layer member 74 in the axial direction of the central axis Ax (the thickness of the middle-layer member 74) may be smaller than the length of the cleaning member 72 in the axial direction. The thickness of the middle-layer member 74 may be smaller than the length of the lower-layer member 76 in the axial direction. When the middle-layer member 74 is made of a harder material than the cleaning member 72 and the lower-layer member 76, the rigidity of the entire cleaning element 70 is increased.

The lower end (bottom surface) of the middle-layer member 74 is located above the polishing surface 62*a* in the axial direction of the central axis Ax. In this case, the distance between the lower end of the middle-layer member 74 and the bottom portion 54 in the axial direction is greater than the distance between the polishing surface 62*a* and the bottom portion 54 in the axial direction. Unlike the example illustrated in FIG. 5C, at least a portion of the middle-layer member 74 may be located at the same height as the polishing surface 62*a* in the axial direction of the central axis Ax. The heights (height positions) of various members included in the polishing element 60 and the cleaning element 70 are defined by the shortest distances to the bottom portion 54 in the axial direction of the central axis Ax. The various positional relationships between the middle-layer member 74 and the polishing surface 62*a* described above are the positional relationships relative to each other when no external force is acting on the cleaning member 72 and the polishing member 62.

The lower-layer member 76 is a member that supports the cleaning member 72 via the middle-layer member 74. The lower-layer member 76 supports the cleaning member 72 such that the cleaning surface 72*a* protrudes beyond the polishing surface 62*a* in the axial direction of the central axis Ax. The distance between the cleaning surface 72*a* and the bottom portion 54 in the axial direction is greater than the distance between polishing surface 62*a* and bottom portion 54 in the axial direction. The length of the lower-layer member 76 in the axial direction is greater than the length of the cleaning member 72 in the axial direction. For example, the length of the lower-layer member 76 in the axial direction is 1.5 to 10 times or 2 to 5 times the length of the cleaning member 72 in the axial direction.

The lower-layer member 76 is made of a material that is softer than the cleaning member 72. The lower-layer member 76 is made of a material that is stretchable in the axial direction of the central axis Ax. When the cleaning member 72 receives a contact force from the rear surface Wb, the lower-layer member 76 shrinks to such an extent that the position (height position) of the cleaning surface 72*a* approaches the position (height position) of the polishing surface 62*a* in the axial direction of the central axis Ax. Specifically, when a downward contact force is applied to the cleaning member 72 from the rear surface Wb, the lower-layer member 76 shrinks to such an extent that the position of the cleaning surface 72*a* substantially coincides with that of the polishing surface 62*a* in the axial direction and the polishing surface 62*a* as well as the cleaning surface 72*a* can be brought into contact with the rear surface Wb.

Each of the cleaning member 72 and the lower-layer member 76 may be made of a material containing pores (micropores). The pore diameter in the lower-layer member 76 may be larger than the pore diameter in the cleaning member 72. The pore diameters in the cleaning member 72 and the lower-layer member 76 may be selected such that the lower-layer member 76 is softer than the cleaning member 72. The cleaning member 72 and the lower-layer member 76 may be made of the same (same type of) material with different pore diameters. Each of the cleaning member 72 and the lower-layer member 76 is, for example, a PVA sponge. In an example, the cleaning member 72 may be made of PVA with a pore diameter (pore size) of 30 μm to 150 μm, and the lower-layer member 76 may be made of PVA with a pore diameter (pore size) of 150 μm to 500 μm. The pore diameter of each of the cleaning member 72 and the lower-layer member 76 may be defined by an average pore diameter, which is measured by, for example, non-contact measurement using an electron microscopy.

The width of the cleaning member 72, the width of the middle-layer member 74, and the width of the lower-layer member 76 substantially coincide with each other. The width of each of the cleaning member 72, the middle-layer member 74, and the lower-layer member 76 is defined by the size of each member in the radial direction of the circumference around the central axis Ax. The width of each of the cleaning member 72, the middle-layer member 74, and the lower-layer member 76 is substantially constant at any position on the circumference around the central axis Ax, and substantially constant at any position in the axial direction of the central axis Ax. The width of the lower-layer member 76 is smaller than the width of the support member 64 of the polishing element 60.

Here, the ratio of the width (length) in the radial direction to the length in the axial direction is defined as an "aspect ratio". The aspect ratio of the cleaning element 70 (the portion including the cleaning member 72, the middle-layer member 74, and the lower-layer member 76) is, for example, 0.6 or less, 0.5 or less, or 0.4 or less. The aspect ratio of the cleaning element 70 is obtained by dividing the width of the lower-layer member 76 in the radial direction by the shortest distance between the lower end of the lower-layer member 76 and the cleaning surface 72*a* in the axial direction. The aspect ratio of the cleaning element 70 is smaller than that of the polishing element 60.

Figure 6A:
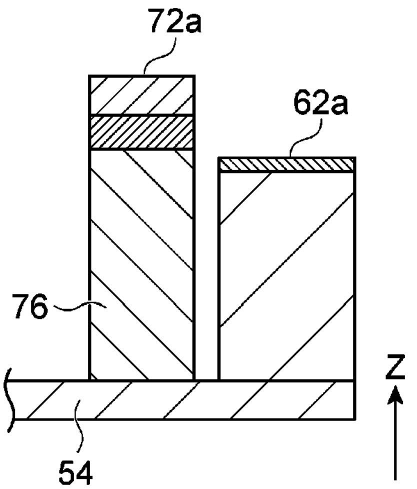
FIGS. 6A to 6C are schematic views illustrating an example of the substrate cleaning member.

Like FIG. 5C, FIG. 6A illustrates the state in which the cleaning surface 72*a* and the polishing surface 62*a* face the rear surface Wb of the workpiece W, and both the cleaning surface 72*a* and the polishing surface 62*a* are not in contact with the rear surface Wb (hereinafter, referred to as a "non-contact state"). In the non-contact state, as described above, the cleaning surface 72*a* protrudes upward relative to the polishing surface 62*a*. When the rear surface Wb is gradually brought closer to the polishing/cleaning mechanism 50 (the cleaning surface 72*a* and the polishing surface 62*a*) from the non-contact state, since the cleaning surface 72*a* protrudes upward, the rear surface Wb does not come into contact with the polishing surface 62*a*, but comes into contact with the cleaning surface 72*a*. When the rear surface Wb comes into contact with the cleaning surface 72*a*, a downward contact force (an external force directed toward the bottom portion 54) acts on the cleaning surface 72*a* (the cleaning element 70 including the cleaning surface 72*a*).

Figure 6B:
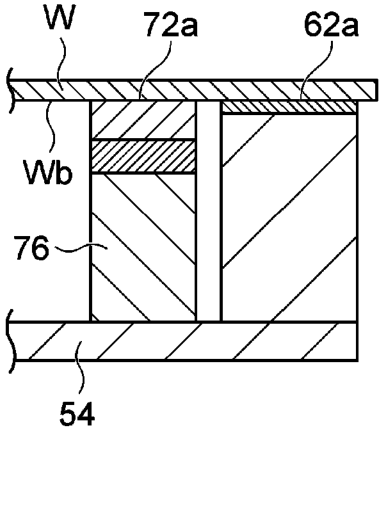

When the downward contact force is applied to the cleaning surface 72*a*, at least the lower-layer member 76 of the cleaning element 70 is shrunk (crushed), and the position of the cleaning surface 72*a* in the axial direction is gradually lowered. When the cleaning surface 72*a* continues to be pressed downward from the rear surface Wb, the polishing surface 62*a* also comes into contact with the rear surface Wb while the cleaning surface 72*a* remains in contact with the rear surface Wb, as illustrated in FIG. 6B. That is, both the cleaning surface 72*a* and the polishing surface 62*a* are in contact with the rear surface Wb of the workpiece W (hereinafter, referred to as a "first contact state").

Figure 6C:
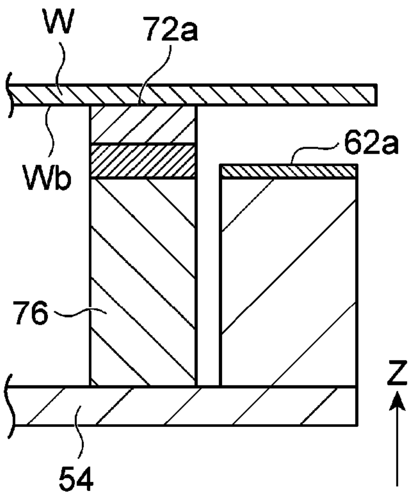
Figure 7:
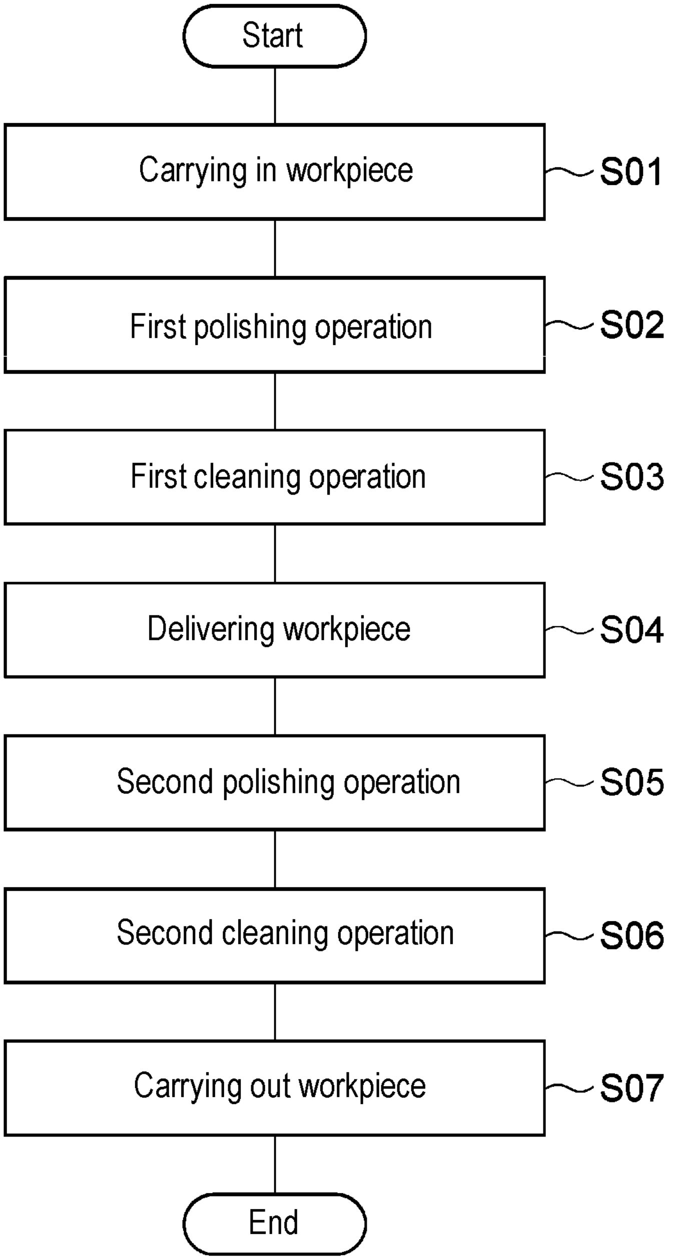
FIG. 7 is a flowchart illustrating an example of a substrate cleaning method.

When the rear surface Wb is gradually moved away from the cleaning surface 72*a* and the polishing surface 62*a* from the first contact state, at least the lower-layer member 76 of the cleaning element 70 will extend to return to its original size (the size in the non-contact state). As a result, as illustrated in FIG. 6C, the polishing surface 62*a* separates from the rear surface Wb and the contact state is released while the cleaning surface 72*a* remains in contact. That is, the cleaning surface 72*a* is in contact with the rear surface Wb of the workpiece W, and the polishing surface 62*a* is not in contact (hereinafter, referred to as a "second contact state"). In addition, then the rear surface Wb is further moved away from the cleaning surface 72*a* and the polishing surface 62*a* from the second contact state, the cleaning surface 72*a* separates from the rear surface Wb and the contact state is released. That is, the non-contact state illustrated in FIG. 6A is obtained.

Returning to FIGS. 3 and 4, the polishing unit 20 includes a support 90, a drive mechanism 92, a cleaning liquid nozzle 96, and a gas nozzle 98. The support 90 is a member that supports the polishing/cleaning mechanism 50 inside the housing 21. The drive mechanism 92 moves the support 90 along one horizontal direction (the X-axis direction in FIG. 3). As the support 90 moves in the X-axis direction, the position of the polishing/cleaning mechanism 50 supported by the support 90 changes in the X-axis direction.

A cleaning liquid nozzle 96 and a gas nozzle 98 are provided at the tip of the support 90. The cleaning liquid nozzle 96 is arranged such that the ejection port thereof faces the rear surface Wb, and supplies a cleaning liquid to the rear surface Wb. The cleaning liquid supplied by the cleaning liquid nozzle 96 is a liquid for washing away polishing chips generated by polishing by the polishing element 60 and particles removed by cleaning by the cleaning element 70. The cleaning liquid supplied by the cleaning liquid nozzle 96 is, for example, pure water. The gas nozzle 98 is arranged such that the ejection port thereof faces the rear surface Wb, and supplies gas to the rear surface Wb. The gas nozzle 98 supplies (sprays) gas to the rear surface Wb for drying the cleaning liquid adhering to the rear surface Wb after cleaning the rear surface Wb. The gas supplied from the gas nozzle 98 is, for example, nitrogen gas.

[Substrate Cleaning Method]

Next, a series of processes executed by the control device 100 that controls at least the polishing unit 20 will be described as an example of a substrate cleaning method with reference to FIGS. 7 to 11. Before executing a series of processes, the top surfaces of the suction pads 24 are disposed at positions higher than the top surface of the polishing/cleaning mechanism 50, and the top surface of the spin chuck 22 is disposed at a position lower than the top surface of the polishing/cleaning mechanism 50.

Figure 8:
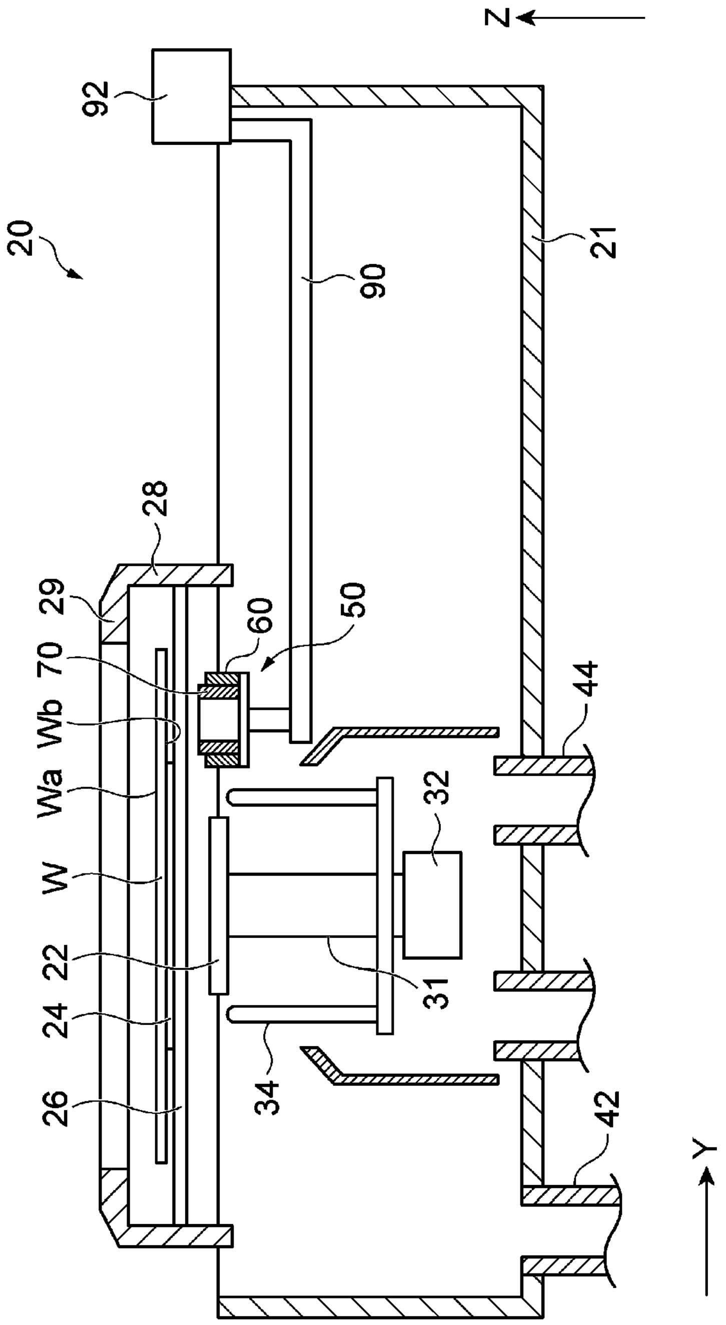
FIG. 8 is a schematic view for describing the example of the substrate cleaning method.

First, the control device 100 executes step S01. In step S01, for example, the control device 100 controls the transfer apparatus A8 and the polishing unit 20 such that a workpiece W to be processed is carried into the housing 21 of the polishing unit 20. In an example, the control device 100 controls the transfer apparatus A8 such that the workpiece W is transferred above the upper cup 29, and then raises the plurality of lifting pins 34 to receive the workpiece W. Then, the control device 100 lowers the plurality of lifting pins 34 holding the workpiece W such that the workpiece W is delivered to the pair of suction pads 24. As a result, as illustrated in FIG. 8, the workpiece W is held by the pair of suction pads 24. In addition, the polishing surface 62*a* of the polishing element 60 and the cleaning surface 72*a* of the cleaning element 70 in the polishing/cleaning mechanism 50 face the rear surface Wb of the workpiece W in the non-contact state.

Next, the control device 100 executes step S02. In step S02, for example, the control device 100 controls the polishing unit 20 to perform a first polishing operation. In the first polishing operation, the control device 100 first controls the polishing unit 20 to transition from the non-contact state to the first contact state in which both the polishing surface 62*a* and the cleaning surface 72*a* are in contact with the rear surface Wb. In an example, the control device 100 lowers the pair of suction pads 24 such that the cleaning surface 72*a* of the cleaning member 72 first comes into contact with the rear surface Wb.

Figure 9:
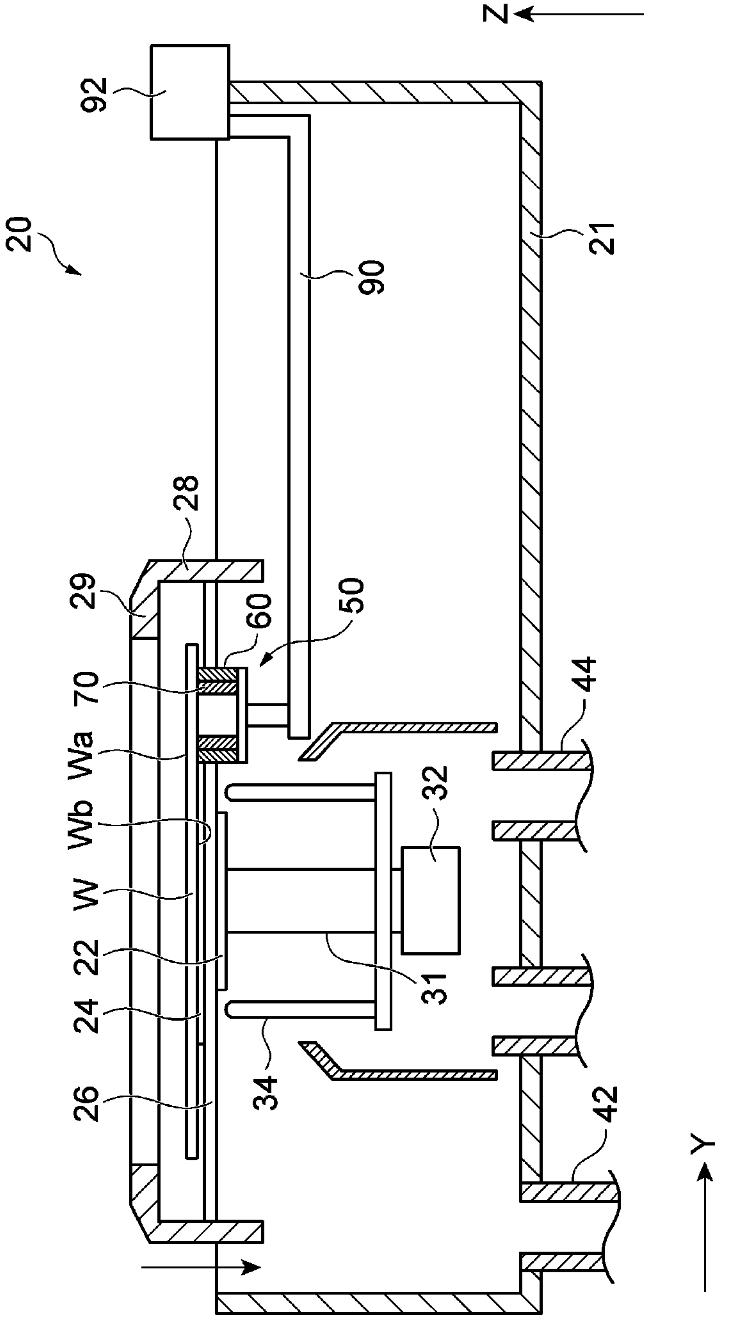
FIG. 9 is a schematic view for describing the example of the substrate cleaning method.

When the control device 100 continues to lower the suction pads 24 even after the cleaning surface 72*a* comes into contact with the rear surface Wb, the lower-layer member 76 of the cleaning member 72 is pressed, and the height position of the cleaning surface 72*a* approaches the height position of the polishing surface 62*a*. When the control device 100 continues to lower the suction pads 24, the polishing surface 62*a* also comes into contact with the rear surface Wb and transitions to the first contact state. FIG. 9 exemplifies a state of transition to the first contact state. The amount by which the pair of suction pads 24 are lowered before transitioning to the first contact state may be measured in advance by an experiment and set.

Figure 10:
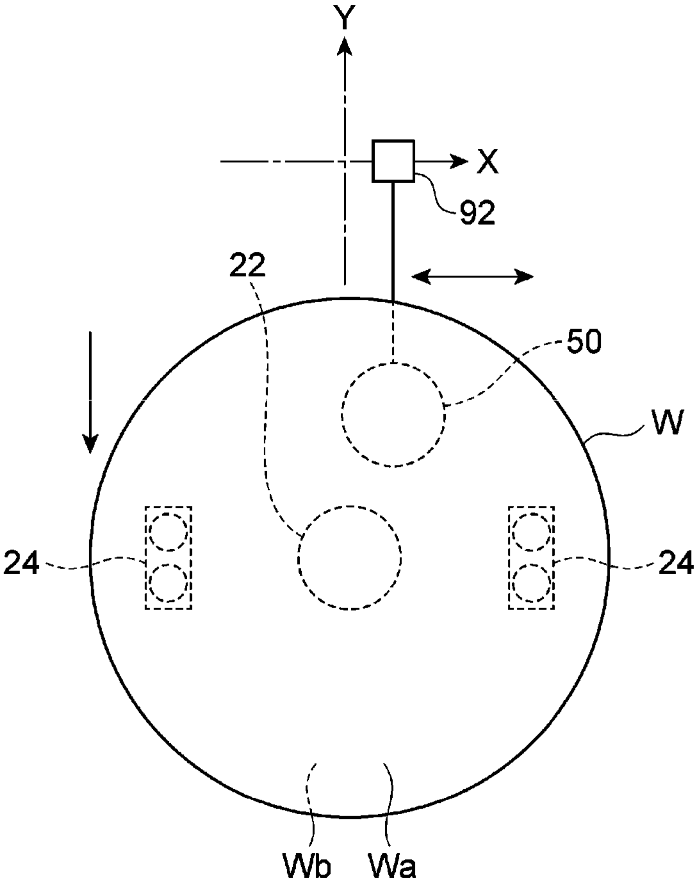
FIG. 10 is a schematic view for describing the example of the substrate cleaning method.

After transitioning to the first contact state, the control device 100 controls the polishing unit 20 to supply a cleaning liquid from the cleaning liquid nozzle 96 to the rear surface Wb and to rotate the base 52 of the polishing/cleaning mechanism 50 around the central axis Ax. Then, as illustrated in FIG. 10, the control device 100 controls the polishing unit 20 to reciprocate the polishing/cleaning mechanism 50 in the X-axis direction by the drive mechanism 92 while moving the suction pad 24 together with the workpiece W along the Y-axis direction. As a result, while the polishing surface 62*a* moves along the rear surface Wb in the state of being in contact with the rear surface Wb, a polishing process is executed on the area located between the pair of suction pads 24 of the rear surface Wb (the area excluding the outer peripheral portion). As described above, the drive mechanism 92 that moves the polishing/cleaning mechanism 50 in the X-axis direction and the rotary drive mechanism 48 that rotates the base 52 function as a driver that moves the polishing surface 62*a* and the cleaning surface 72*a* along the rear surface Wb of the workpiece W held by the pair of suction pads 24.

Figure 11:
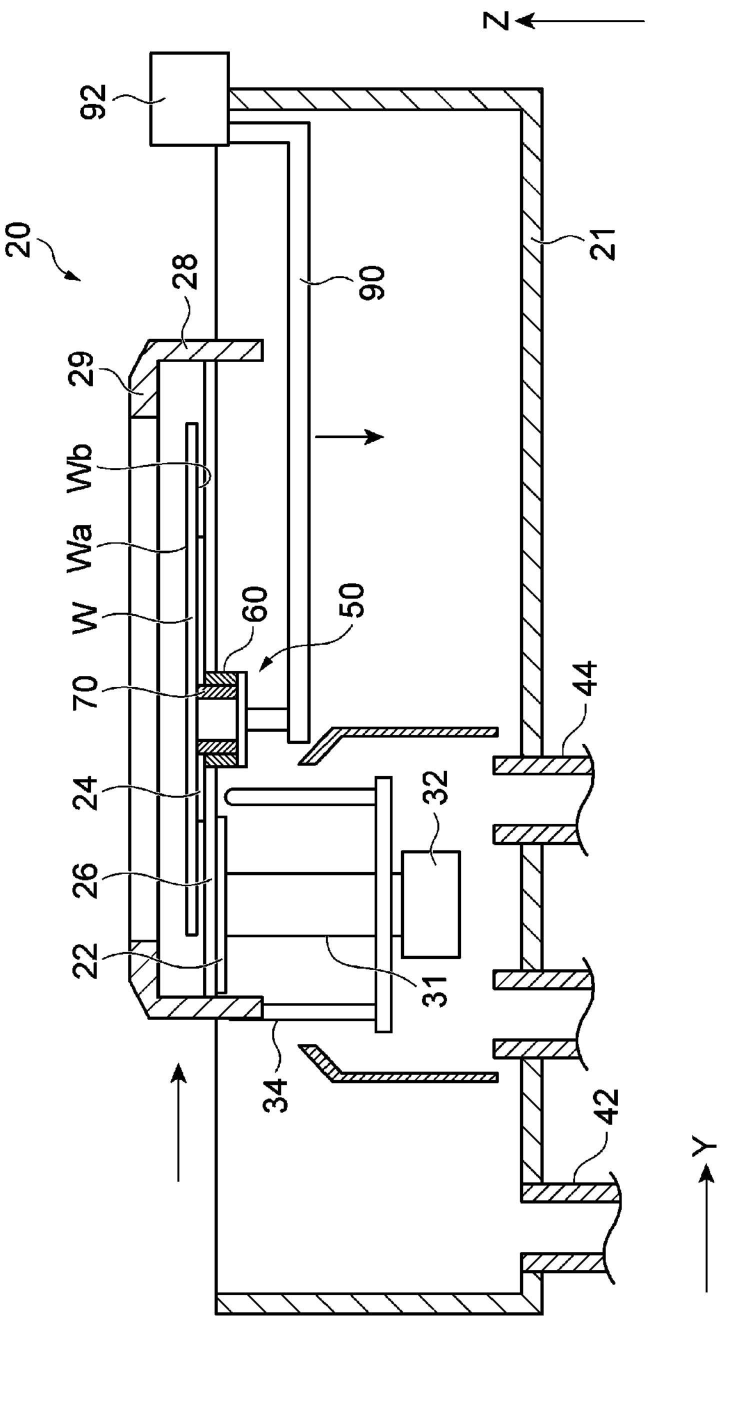
FIG. 11 is a schematic view for describing the example of the substrate cleaning method.

Next, the control device 100 executes step S03. In step S03, for example, the control device 100 controls the polishing unit 20 to execute a first cleaning operation. In the first cleaning operation, the control device 100 first controls the polishing unit 20 to transition from the first contact state to the second contact state in which the polishing surface 62*a* does not come into contact with the rear surface Wb and the cleaning surface 72*a* comes into contact with the rear surface Wb. In an example, the control device 100 lowers the polishing/cleaning mechanism 50 to move the polishing/cleaning mechanism 50 away from the rear surface Wb by the drive mechanism 92, so that the polishing surface 62*a* separates from the rear surface Wb while the cleaning surface 72*a* remains in contact with the rear surface Wb. As a result, the first contact state transitions to the second contact state. FIG. 11 illustrates a state of transition to the second contact state. The amount by which the polishing/cleaning mechanism 50 is lowered before transitioning to the second contact state may be measured in advance by an experiment and set.

After transitioning to the second contact state, the control device 100 controls the polishing unit 20 to supply a cleaning liquid from the cleaning liquid nozzle 96 to the rear surface Wb and to rotate the base 52 of the polishing/cleaning mechanism 50 around the central axis Ax. Then, as in the polishing process in step S02, the control device 100 controls the polishing unit 20 to reciprocate the polishing/cleaning mechanism 50 in the X-axis direction by the drive mechanism 92 while moving the suction pad 24 together with the workpiece W along the Y-axis direction. As a result, while the cleaning surface 72*a* of the cleaning member 72 moves along the rear surface Wb in the state of being in contact with the rear surface Wb, a cleaning process is executed on the area located between the pair of suction pads 24 of the rear surface Wb (the area excluding the outer peripheral portion). After the cleaning process, the control device 100 controls the polishing unit 20 to transition from the second contact state to the non-contact state.

Next, the control device 100 executes step S04. In step S04, for example, the control device 100 controls the polishing unit 20 such that the workpiece W is delivered from the pair of suction pads 24 to the spin chuck 22. In an example, the control device 100 controls the polishing unit 20 to raise the spin chuck 22 in a state in which the center of the workpiece W held by the pair of suction pads 24 and the center of the spin chuck 22 substantially coincide with each other. As a result, the spin chuck 22 receives the workpiece W, and the workpiece W is held by the spin chuck 22.

Next, the control device 100 executes step S05. In step S05, for example, the control device 100 controls the polishing unit 20 to execute a second polishing operation. In an example, the control device 100 controls the polishing unit 20 to transition from the non-contact state to the first contact state in a state in which the polishing surface 62*a* and the cleaning surface 72*a* face the outer peripheral portion of the rear surface Wb of the workpiece W held by the spin chuck 22.

After transitioning to the first contact state, the control device 100 controls the polishing unit 20 to supply a cleaning liquid from the cleaning liquid nozzle 96 to the rear surface Wb and to rotate the base 52 of the polishing/cleaning mechanism 50 around the central axis Ax. Then, the control device 100 controls the polishing unit 20 to rotate the workpiece W held by the spin chuck 22 around the rotary axis of the spin chuck 22, and to reciprocate the polishing/cleaning mechanism 50 in the X-axis direction by the drive mechanism 92. As a result, while the polishing surface 62*a* moves along the rear surface Wb in the state of being in contact with the rear surface Wb, a polishing process is executed on the outer peripheral portion of the rear surface Wb. Rotation of the spin chuck 22 changes the relative positions of the polishing surface 62*a* and the cleaning surface 72*a* with respect to the rear surface Wb. Therefore, the drive mechanism, which rotates the spin chuck 22, also functions as a driver that moves the polishing surface 62*a* and the cleaning surface 72*a* along the rear surface Wb of the workpiece W held by the spin chuck 22.

Next, the control device 100 executes step S06. In step S06, for example, the control device 100 controls the polishing unit 20 to execute a second cleaning operation. In the second cleaning process, the control device 100 first controls the polishing unit 20 to transition from the first contact state to the second contact state.

After transitioning to the second contact state, the control device 100 controls the polishing unit 20 to supply a cleaning liquid from the cleaning liquid nozzle 96 to the rear surface Wb and to rotate the base 52 of the polishing/cleaning mechanism 50 around the central axis Ax. Then, as in the polishing process in step S05, the control device 100 controls the polishing unit 20 to rotate the workpiece W around the rotary axis of the spin chuck 22, and to reciprocate the polishing/cleaning mechanism 50 in the X-axis direction by the drive mechanism 92. As a result, while the cleaning surface 72*a* of the cleaning member 72 moves along the rear surface Wb in the state of being in contact with the rear surface Wb, a cleaning process is executed on the outer peripheral portion of the rear surface Wb. After the cleaning process, the control device 100 controls the polishing unit 20 to transition from the second contact state to the non-contact state.

In addition, the control device 100 may control the polishing unit 20 such that the cleaning liquid is supplied from the cleaning nozzle 36 to the front surface Wa of the workpiece W in parallel with at least some of steps S02, S03, S05, and S06. After step S06 is executed, the control device 100 may control the polishing unit 20 so that the spin chuck 22 holding the workpiece W continues to rotate. While causing the spin chuck 22 to continue to rotate, the control device 100 may control the polishing unit 20 to supply a gas for drying from the gas nozzle 37 to the front surface Wa and to supply a gas for drying from the gas nozzle 98 to the rear surface Wb. As a result, the cleaning liquid is removed from the front surface Wa and the rear surface Wb of the workpiece W.

Next, the control device 100 executes step S07. In step S07, for example, the control device 100 controls the polishing unit 20 and the transfer apparatus A8 such that the workpiece W is carried out from the polishing unit 20. In an example, after raising the plurality of lifting pins 34 to receive the workpiece W from the spin chuck 22, the control device 100 controls the polishing unit 20 and the transfer apparatus A3 such that the workpiece W is delivered from the plurality of lifting pins 34 to the transfer apparatus A3. Consequently, the substrate cleaning process including the polishing process and the cleaning process is completed for one workpiece W.

Modifications

Figure 12:
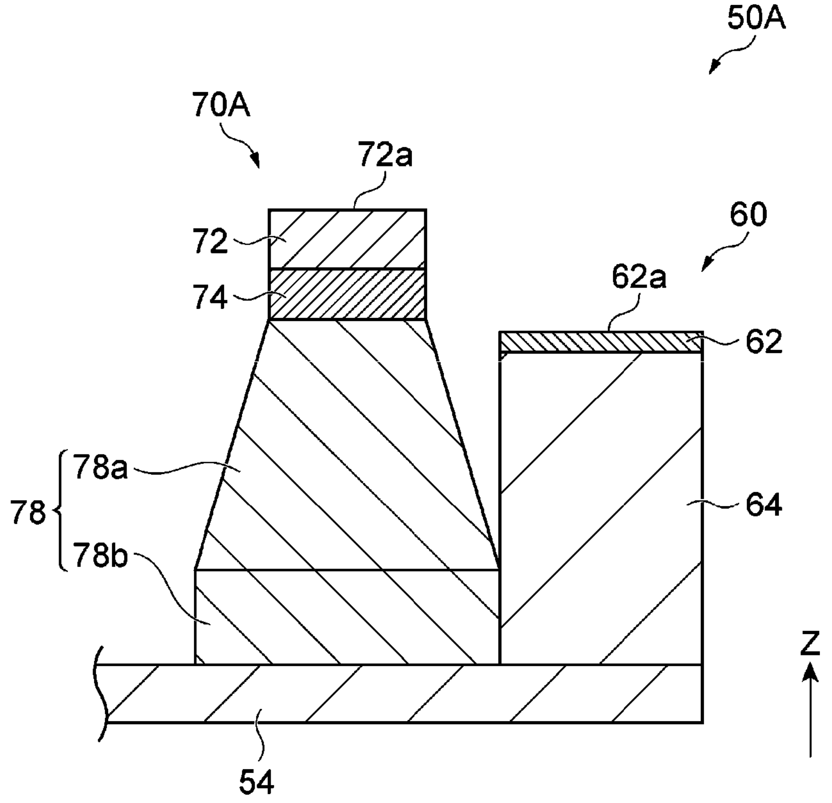
FIG. 12 is a schematic view illustrating a substrate cleaning member.

As illustrated in FIG. 12, the polishing unit 20 may include a polishing/cleaning mechanism 50A instead of the polishing/cleaning mechanism 50. The polishing/cleaning mechanism 50A (a substrate cleaning member) is different from the polishing/cleaning mechanism 50 in that the polishing/cleaning mechanism 50A includes a cleaning element 70A instead of the cleaning element 70. The cleaning element 70A includes a cleaning member 72 and a middle-layer member 74, and includes a lower-layer member 78 instead of the lower-layer member 76. The lower-layer member 78 includes an upper portion 78*a* and a lower portion 78*b*, which are arranged vertically. The upper portion 78*a* is formed such that the width (length) in the radial direction of the circumference around the central axis Ax increases as the distance between the upper portion 78*a* and the cleaning surface 72*a* of the cleaning member 72 increases. The width of the lower portion 78*b* is substantially constant even if positions in the axial direction in which the central axis Ax extends are different. The outer edge (outer peripheral edge) of the lower end of the upper portion 78*a* and the outer edge (outer peripheral surface) of the lower portion 78*b* are in contact with the inner peripheral surface of the support member 64.

Figure 13:
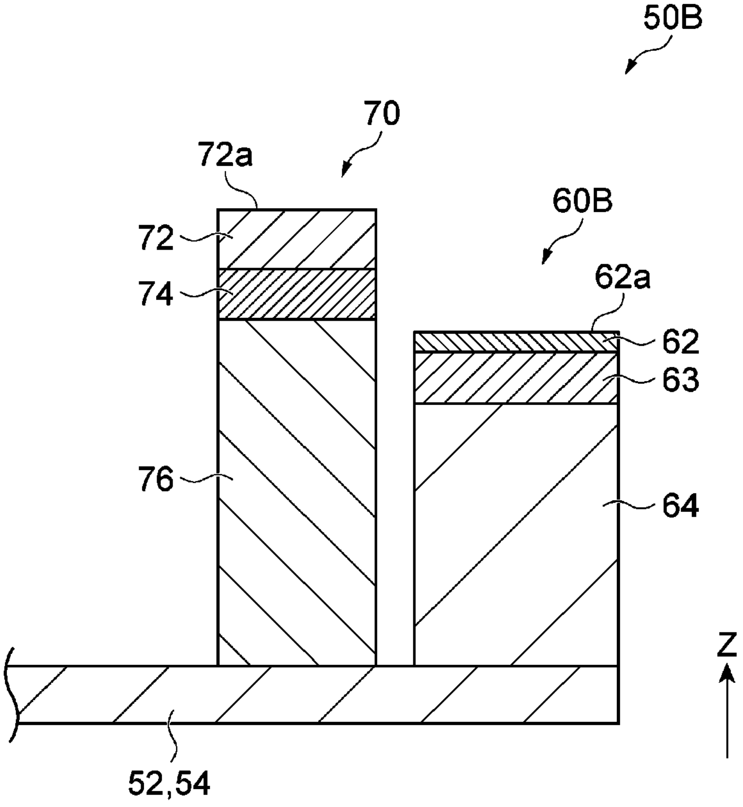
FIG. 13 is a schematic view illustrating a substrate cleaning member.

As illustrated in FIG. 13, the polishing unit 20 may include a polishing/cleaning mechanism 50B instead of the polishing/cleaning mechanism 50. The polishing/cleaning mechanism 50B (a substrate cleaning member) differs from the polishing/cleaning mechanism 50 in that the polishing/cleaning mechanism 50B includes a polishing element 60B instead of the polishing element 60. The polishing element 60B includes a middle-layer member 63 in addition to the polishing member 62 and the support member 64. The middle-layer member 63 is disposed between the polishing member 62 and the support member 64. The polishing member 62 and the middle-layer member 63 are connected to each other by an adhesive or the like. The middle-layer member 63 and the support member 64 are connected to each other by an adhesive or the like. Like the polishing member 62 and the support member 64, the middle-layer member 63 is formed in an annular shape to extend along the circumference around the central axis Ax.

The middle-layer member 63 may be formed in a plate shape. The thickness of the middle-layer member 63 may be about 0.1 mm to 4.0 mm. The middle-layer member 63 is made of a material that is softer than the polishing member 62 and harder than the support member 64. That is, the hardness of the middle-layer member 63 is lower than the hardness of the polishing member 62 and higher than the hardness of the support member 64. The middle-layer member 63 may be made of a resin material. The resin material forming the middle-layer member 63 is, for example, polypropylene (PP), polyethylene (PE), polyvinyl chloride (PVC), urethane, polycarbonate, or the like. The middle-layer member 63 may be configured by stacking a plurality of members made of different materials.

The mutual positional relationship between the polishing element 60 and the cleaning element 70 or 70A in the radial direction of the circumference is not limited to the examples described above. The cleaning element 70 or 70A may be disposed outside the polishing element 60. In this case, the cleaning surface 72*a* of the cleaning member 72 is located outside the polishing surface 62*a* of the polishing member 62.

Of the polishing element 60 and the cleaning element 70 or 70A, the element located at the inner side may be formed in a disk shape (solid columnar shape) instead of an annular shape (cylindrical shape). In this case, the top surface of the element located at the inner side (the polishing surface 62*a* or the cleaning surface 72*a*) may be formed in a continuous circular shape, or may be divided into a plurality of fan-shaped portions. In either case, the outer edge of the polishing surface 62*a* or cleaning surface 72*a* located at the inner side is formed along the circumference around the central axis Ax.

The coating/developing apparatus 2 may be configured in the same manner as the polishing/cleaning mechanism 50, and may include a cleaning mechanism (substrate cleaning member) having a function of performing two types of cleaning processes without having a function of performing a polishing process. This cleaning mechanism has the same configuration as the polishing/cleaning mechanism 50, but includes a cleaning element separate from the cleaning element 70 instead of the polishing element 60. The separate cleaning element may be formed in an annular (cylindrical) shape outside the cleaning element 70, similarly to the polishing element 60. The separate cleaning element includes a separate cleaning member including a separate cleaning surface (first contact surface) that functions as a cleaning surface. The separate cleaning member (first member) is capable of cleaning the rear surface Wb by moving along the rear surface Wb while the separate cleaning surface is in contact with the rear surface Wb. At least one of surface roughness and hardness differs between the cleaning surface 72*a* of the cleaning member 72 and the separate cleaning surface. A cleaning mechanism that does not have the function of performing a polishing process may perform a cleaning process on the front surface Wa of the work W instead of or in addition to the rear surface Wb.

To one of the above-described various examples, at least some of the features described in other examples may be applied.

Summary of Embodiment

The present disclosure includes the following configurations (1) to (9).

(1) A substrate cleaning member including: a first member including a first contact surface, an outer edge of which is formed along a circumference around a central axis Ax, wherein the first member is configured to clean or polish a main surface of a workpiece W by moving the first contact surface along the main surface while the first contact surface is in contact with the main surface; a second member (the cleaning member 72) including a second contact surface (the cleaning surface 72*a*), an outer edge of which is formed along the circumference outside or inside the first contact surface, wherein the second member is configured to clean the main surface by moving the second contact surface along the main surface while the second contact surface is in contact with the main surface; a lower-layer member 76 or 78 configured to support the second member such that the second contact surface protrudes beyond the first contact surface in an axial direction in which the central axis Ax extends; and a base 52 configured to support the first member, the second member, and the lower-layer member 76 or 78, wherein the second contact surface is configured such that at least one of surface roughness and hardness of the second contact surface is different from that of the first contact surface, and wherein the lower-layer member 76 or 78 is made of a softer material than the second member such that, when the second member receives a contact force from the main surface, the position of the second contact surface approaches the position of the first contact surface in the axial direction.

In the substrate cleaning member, the second contact surface of the second member that performs the cleaning process is configured to approach the first contact surface of the first member by the contact force from the main surface. As a result, by adjusting the contact force, two processes (a cleaning process and a process other than the cleaning process (e.g., a polishing process)) can be performed with a single substrate cleaning member. In this case, the preparation period between the two processes can be shortened, so that the efficiency of the processes can be improved. On the other hand, depending on the type of the workpiece W, it is necessary to form the portion that constitutes the contact surface for cleaning with a hard material. In this case, when the portion from the base 52 to the contact surface for cleaning is made of only a hard material, even if the portion receives the contact force from the main surface, the portion may not shrink sufficiently, and the first contact surface for performing other processes may not come into contact with the workpiece W. In contrast, in the substrate cleaning member, the second member forming the second contact surface is supported by the lower-layer member made of a softer material than the second member. Therefore, even if the second member is made of a hard material, the second member may shrink to such an extent that the first contact surface of the first member can be brought into contact with the main surface of the workpiece W when receiving the contact force from the main surface. Thus, two processes can be performed with a single substrate cleaning member. Therefore, the substrate cleaning member is useful for improving the efficiency of processes.

(2) The substrate cleaning member of item (1), wherein each of the second member and the lower-layer member 76 or 78 is made of a material including pores, and wherein a pore diameter in the lower-layer member 76 or 78 is larger than a pore diameter in the second member.

In this case, it is easier to form the lower-layer member 76 or 78 to be expandable and contractible than the second member.

(3) The substrate cleaning member of item (1) or (2), further including a middle-layer member 74 disposed between the second member and the lower-layer member 76 or 78 and made of a material harder than the second member and the lower-layer member 76 or 78, wherein the second member, the middle-layer member 74, and the lower-layer member 76 or 78 are formed in an annular shape to extend along the circumference.

Since the second contact surface of the second member moves along the main surface of the workpiece W while being in contact with the main surface of the workpiece W, a force acts on the annular portion made up of the second member, the middle-layer member 74, and the lower-layer member 76 or 78 in a transverse direction that intersects with the direction of extension of the annular portion. Even if this force in the transverse direction is applied, since the rigidity of the annular portion is increased by the middle-layer member 74, the annular portion is less likely to fall inward or outward. Therefore, it is useful for stabilizing processes.

(4) The substrate cleaning member of item (3), wherein in the axial direction, a lower end of the middle-layer member 74 is located above the first contact surface, or at least a portion of the middle-layer member 74 is located at the same height as the first contact surface.

In this case, it is easy to make the length of the lower-layer member 76 or 78 in the axial direction, which contracts due to the contact force from the main surface of the workpiece W, greater than that of the second member. As a result, the two processes can be executed more reliably while performing cleaning suitable for the type of the workpiece W.

(5) The substrate cleaning member of item (3) or (4), wherein the length of the lower-layer member 76 or 78 in the axial direction is greater than the length of the second member in the axial direction.

In this case, by the contact force from the main surface of the workpiece W, the position of the second contact surface can be more reliably brought closer to the first contact surface. Therefore, the two processes can be performed more reliably while performing cleaning suitable for the type of the workpiece W.

(6) The substrate cleaning member of item (3) or (4), wherein the lower-layer member 76 has a width that substantially coincides with the width of the second member in a radial direction of the circumference.

In this case, compared to the case where the width of the lower-layer member 76 is larger than the width of the second member, the area of the portion including the lower-layer member 76 and the second member when viewed in the axial direction can be reduced. Therefore, it is useful for simplification of the substrate cleaning member.

(7) The substrate cleaning member of item (3) or (4), wherein at least a portion of the lower-layer member 78 is formed such that a width in a radial direction of the circumference increases as a distance between the portion of lower-layer member 78 and the second contact surface increases, and is in contact with a support portion (the support member 64) that supports the first member.

In this case, even if the portion including the lower-layer member 78 and the second member receives force in the transverse direction along the main surface of the workpiece W, the portion is less likely to fall. Therefore, it is useful for stabilizing processes.

(8) A substrate processing apparatus including: the substrate cleaning member according to any one of items (1) to (7); a substrate holder configured to hold a workpiece W; and a driver configured to move the first contact surface and the second contact surface along the main surface of the workpiece W held by the substrate holder.

This substrate processing apparatus is useful for improving the efficiency of processes by including the above-described substrate cleaning member.

(9) A substrate cleaning method including: a polishing operation of polishing a main surface of a substrate by a substrate cleaning member; and a cleaning operation of cleaning the main surface by the substrate cleaning member after the polishing operation, wherein the substrate cleaning member includes: a first member including a first contact surface, an outer edge of which is formed along a circumference around a predetermined axis Ax; a second member (the cleaning member 72) including a second contact surface (the cleaning surface 72*a*), an outer edge of which is formed along the circumference outside or inside the first contact surface; a lower-layer member 76 or 78 configured to support the second member and made of a softer material than the second member; and a base 52 configured to support the first member, the second member, and the lower-layer member 76 or 78, wherein the second contact surface is configured such that at least one of surface roughness and hardness of the second contact surface is different from that of the first contact surface, wherein the polishing operation includes: bringing the first contact surface and the second contact into contact with the main surface by applying a force to the second member from the main surface while the lower-layer member 76 or 78 supports the second member such that the second contact surface protrudes beyond the first contact surface in the axial direction in which the axis Ax extends; and moving the first contact surface and the second contact surface along the main surface while the first contact surface and the second contact surface are in contact with the main surface, and wherein the cleaning operation includes moving the second contact surface along the main surface while the first contact surface is not in contact with the main surface and the second contact surface is in contact with the main surface.

This substrate cleaning method is useful for improving the efficiency of processes, as with the substrate cleaning member described in item (1).

According to the present disclosure, a substrate cleaning member, a substrate processing apparatus, and a substrate cleaning method useful for improving the efficiency of processes performed on a substrate are provided.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate cleaning member comprising:

a first member including a first contact surface, an outer edge of which is formed along a circumference around a predetermined axis, wherein the first member is configured to clean or polish a main surface of a substrate by moving the first contact surface along the main surface while the first contact surface is in contact with the main surface;

a second member including a second contact surface, an outer edge of which is formed along the circumference outside or inside the first contact surface, wherein the second member is configured to clean the main surface by moving the second contact surface along the main surface while the second contact surface is in contact with the main surface;

a lower-layer member configured to support the second member such that the second contact surface protrudes beyond the first contact surface in an axial direction in which the predetermined axis extends; and a base configured to support the first member, the second member and the lower-layer member, wherein the second contact surface is configured such that at least one of surface roughness and hardness of the second contact surface is different from that of the first contact surface, wherein the lower-layer member is made of a softer material than the second member such that, when the second member receives a contact force from the main surface, a position of the second contact surface approaches a position of the first contact surface in the axial direction, wherein each of the second member and the lower-layer member is made of a material including pores, and wherein a pore diameter in the lower-layer member is larger than a pore diameter in the second member.

2. The substrate cleaning member of claim 1, further comprising a middle-layer member disposed between the second member and the lower-layer member and made of a material harder than the second member and the lower-layer member, wherein the second member, the middle-layer member, and the lower-layer member are formed in an annular shape to extend along the circumference.

3. The substrate cleaning member of claim 2, wherein, in the axial direction, a lower end of the middle-layer member is located above the first contact surface, or at least a portion of the middle-layer member is located at a same height as the first contact surface.

4. The substrate cleaning member of claim 2, wherein a length of the lower-layer member in the axial direction is greater than a length of the second member in the axial direction.

5. The substrate cleaning member of claim 2, wherein the lower-layer member has a width that coincides with a width of the second member in a radial direction of the circumference.

6. The substrate cleaning member of claim 2, wherein at least a portion of the lower-layer member is formed such that a width in a radial direction of the circumference increases as a distance between the portion of the lower-layer member and the second contact surface increases, and is in contact with a support portion that supports the first member.

7. A substrate processing apparatus comprising:

the substrate cleaning member according to claim 1;

a substrate holder configured to hold the substrate; and a driver configured to move the first contact surface and the second contact surface along the main surface of the substrate held by the substrate holder.

8. A substrate cleaning method comprising:

polishing a main surface of a substrate by a substrate cleaning member; and cleaning the main surface by the substrate cleaning member after the polishing of the main surface, wherein the substrate cleaning member includes:

a first member including a first contact surface, an outer edge of which is formed along a circumference around a predetermined axis;

a second member including a second contact surface, an outer edge of which is formed along the circumference outside or inside the first contact surface;

a lower-layer member configured to support the second member such that the second contact surface protrudes beyond the first contact surface in an axial direction in which the predetermined axis extends and made of a softer material than the second member; and a base configured to support the first member, the second member, and the lower-layer member, wherein the second contact surface is configured such that at least one of surface roughness and hardness of the second contact surface is different from that of the first contact surface, wherein each of the second member and the lower-layer member is made of a material including pores, wherein a pore diameter in the lower-layer member is larger than a pore diameter in the second member, and wherein the polishing of the main surface includes:

bringing the first contact surface and the second contact surface into contact with the main surface by applying a force to the second member from the main surface while the lower-layer member supports the second member such that the second contact surface aligns with the first contact surface in the axial direction; and moving the first contact surface and the second contact surface along the main surface while the first contact surface and the second contact surface are in contact with the main surface, and wherein the cleaning of the main surface includes:

moving the second contact surface along the main surface while the first contact surface is not in contact with the main surface and the second contact surface is in contact with the main surface.

* * * * *